(12) United States Patent
Chen et al.

(10) Patent No.: US 8,205,848 B2
(45) Date of Patent: Jun. 26, 2012

(54) TEST FIXTURE

(75) Inventors: Yung-Jen Chen, Tu-Cheng (TW); Lan-Yung Hsiao, Tu-Cheng (TW); Shih-Hao Hu, Tu-Cheng (TW)

(73) Assignee: Cheng Uei Precision Industry Co., Ltd., Tu-Cheng, Taipei Hsien (TW)

( * ) Notice: Subject to any disclaimer, the term of this patent is extended or adjusted under 35 U.S.C. 154(b) by 727 days.

(21) Appl. No.: 12/250,903

(22) Filed: Oct. 14, 2008

(65) Prior Publication Data

US 2010/0090704 A1 Apr. 15, 2010

(51) Int. Cl.
*A47B 91/00* (2006.01)
(52) U.S. Cl. .......... 248/346.01; 248/346.06; 248/346.03
(58) Field of Classification Search ............. 248/346.03, 248/346.06, 346.07, 346.5, 346.01, 316.4
See application file for complete search history.

(56) References Cited

U.S. PATENT DOCUMENTS

| | | | | |
|---|---|---|---|---|
| 4,497,477 A * | 2/1985 | Abel | | 269/303 |
| 5,839,713 A * | 11/1998 | Wright | | 248/346.01 |
| 6,416,719 B1 * | 7/2002 | Fawcett et al. | | 422/561 |
| 6,513,260 B2 * | 2/2003 | Krajec et al. | | 33/645 |
| 7,828,253 B2 * | 11/2010 | Meyer | | 248/129 |
| 2002/0003197 A1 * | 1/2002 | MacEachern | | 248/346.01 |
| 2004/0007651 A1 * | 1/2004 | Williams et al. | | 248/346.06 |
| 2009/0152428 A1 * | 6/2009 | Cilia | | 248/346.03 |

* cited by examiner

*Primary Examiner* — Amy Sterling
*Assistant Examiner* — Erin W Smith
(74) *Attorney, Agent, or Firm* — Muncy, Geissler, Olds & Lowe, PLLC

(57) ABSTRACT

A test fixture is mounted to a supporting base and adapted for holding an electronic device, such as a laptop computer, a mobile phone and so on, on the purpose of testing an antenna characteristic of the electronic device. The test fixture includes a first fixing component and a second fixing component. The first fixing component is adapted for being mounted to the supporting base and has a first basic plate adapted for carrying the laptop computer. The second fixing component is removably mounted to the first fixing component, and has a plurality of supporting rods suspending above the first basic plate adapted for clamping the mobile phone therebetween.

5 Claims, 4 Drawing Sheets

TEST FIXTURE

BACKGROUND OF THE INVENTION

1. Field of the Invention

The present invention relates to a test fixture, and more particularly to a test fixture adapted for holding an electronic device.

2. The Related Art

To ensure that electronic devices can operate normally and steadily in long usage duration, the electronic devices usually need to undergo various quality control (QC) tests before mass production or leaving the factory. Even though some of the QC tests have already been executed by the test machines before assembly, some of the QC tests still need to be done after the assembly of the electronic devices, for example, the antenna mounted on the electronic device which is easy to be affected by ambience. Therefore, it is desirable to design a test fixture especially adapted for testing the antenna characteristic of the electronic devices.

SUMMARY OF THE INVENTION

Accordingly, an object of the present invention is to provide a test fixture especially adapted for testing an antenna characteristic of an electronic device.

The test fixture is mounted to a supporting base and adapted for holding the electronic device, such as a laptop computer, a mobile phone and so on, on purpose of testing an antenna characteristic of the electronic device. The test fixture includes a first fixing component and a second fixing component. The first fixing component is adapted for being mounted to the supporting base and has a first basic plate adapted for carrying the laptop computer. The second fixing component is removably mounted to the first fixing component, and has a plurality of supporting rods suspending above the first basic plate adapted for clamping the mobile phone therebetween.

As described above, the first fixing component mounted to the supporting base has the first basic plate used for carrying the electronic device of biggish size, such as the laptop computer. Such structure is a simple, and easy to be manufactured and assembled. Meanwhile, the second fixing component with the supporting rods is removably mounted on the first fixing component, which is enabled to fix the electronic device of small size, such as the mobile phone. Thus the test fixture can fix the electronic devices of different sizes, which enlarges the application range thereof.

BRIEF DESCRIPTION OF THE DRAWINGS

The present invention will be apparent to those skilled in the art by reading the following description when taken in conjunction with the accompanying drawings, in which.

DETAILED DESCRIPTION OF THE EMBODIMENT

Figure 1:
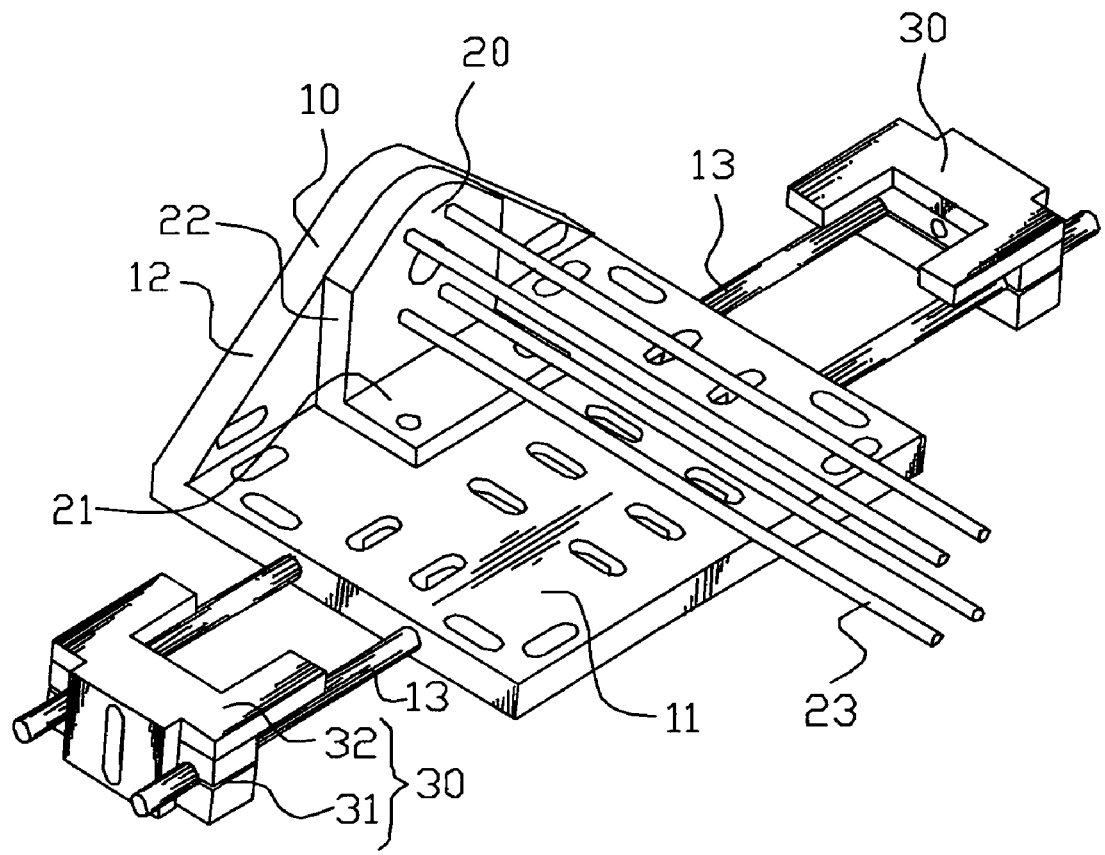
FIG. 1 is an assembled, perspective view of a test fixture in accordance with an embodiment of the present invention.
Figure 2:
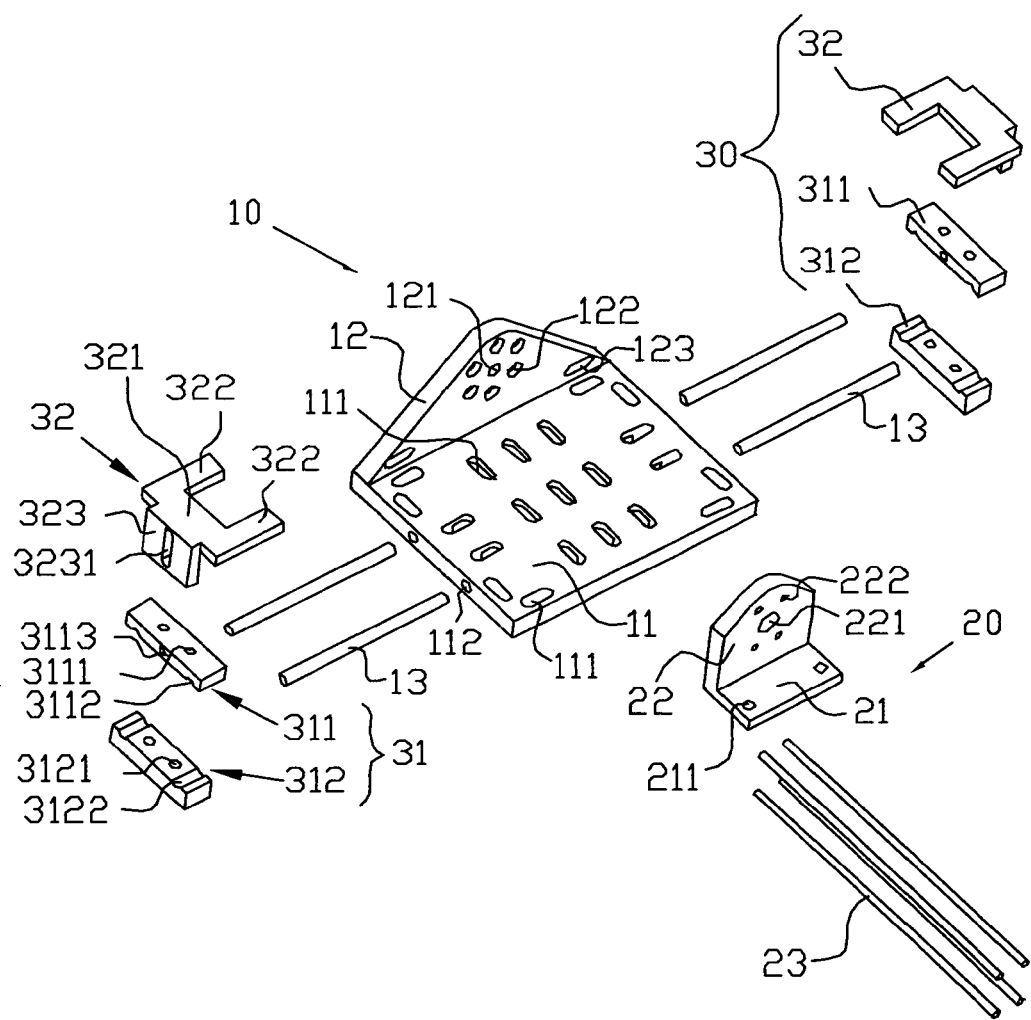
FIG. 2 is an exploded, perspective view of the test fixture shown in FIG. 1.

With reference to FIG. 1 and FIG. 2, a test fixture of an embodiment according to the present invention is shown. The test fixture mounted on a supporting base (not shown) for holding an electronic device (not shown) includes a first fixing component 10 and a second fixing component 20 mounted on the first fixing component 10.

The first fixing component 10 includes a first basic plate 11 and a first fixing plate 12 extending perpendicularly from an end of the first basic plate 11. The first basic plate 11 defines a plurality of through holes 111 adapted for fixing the second fixing component 20 and the electronic device. In this embodiment, the first basic plate 11 has more through holes 111 arranged regularly for lighting the weight of the first fixing component 10. Thereinto, there are nine through holes 111 arranged in a matrix manner in the center of the first basic plate 11, four through holes 111 are disposed symmetrically at two sides of the first basic plate 11, and eight through holes 111 are evenly arranged at four corners of the first basic plate 11. Meanwhile, the first basic plate 11 has two buckling holes 112 at two opposite sides thereof, respectively. Each of the buckling holes 112 receives an end of a sliding rod 13.

The first fixing plate 12 is substantially a triangle shape, and has a wire hole 121 at a center thereof for allowing a test cable (not shown) passing therethrough to transmit signal, and a plurality of fixing holes 122 around the wire hole 121 for fixing the first fixing component 10 to the supporting base firmly. In this case, a plurality of screws (not shown) is adapted to engage the supporting base with the fixing holes 122 for fastening the first fixing component 10 to the supporting base. A bottom portion of the first fixing plate 12 has two through holes 123 at two ends thereof. In this case, a tape may be adapted to pass through the through holes 123 and 111 for fastening the electronic device to the first basic plate 11 firmly.

A stopping member 30 is slidably mounted on the sliding rods 13. The stopping member 30 includes a sliding element 31 and a stopping element 32. The sliding element 31 has an upper portion 311 and a bottom portion 312 coupled with the upper portion 311. The upper portion 311 is a rectangular shape and has two thread holes 3111 at a top thereof. The thread holes 3111 extend upwardly and downwardly, and pass through the whole upper portion 311. One side of the upper portion 311 opposite to the first basic plate 11 defines a stopping hole 3113 arranged between the thread holes 3111 and extending toward the other side thereof. A bottom surface of the upper portion 311 has two sliding recesses 3112. The sliding recess 3112 extends parallel to the stopping hole 3113 and passes through the whole bottom surface of the upper portion 311. The bottom portion 312 is analogous to the upper portion 311 except that the bottom portion 312 doesn't have the stopping hole. Two screws (not shown) are adapted to pass through the thread holes 3111 and 3121 for connecting the upper portion 311 and the bottom portion 312 together. The sliding recess 3112 faces the corresponding sliding recess 3122 to form a through hole for allowing the sliding rod 13 to pass therethrough. Thus the sliding element 31 is moved and fixed on the sliding rods 13 optionally via adjusting the screws. In addition, it should be noted that the upper portion 311 might be integrated with the bottom portion 312 for meeting different demands and should not be limited.

The stopping element 32 defines a rectangular stopping plate 321. One end of the stopping plate 321 extends outwards to form two stopping arms 322 spaced away from each other. The other end of the stopping plate 321 bends downwardly to form a holding plate 323 with a holding hole 3231 defined thereon. The holding hole 3231 has a larger dimension in cross section than that of a screw (not shown) in a direction perpendicular to the stopping plate 321 for allowing the screw to be movable therealong. The stopping plate 321 is disposed on the sliding element 31 with the stopping arms 322 exceeding the sliding element 31. The holding plate 323 is attached to a side of the sliding element 31 opposite to the first basic plate 11 with the screw passed through the holding hole 3231 and the stopping hole 3113 for connecting the sliding element 31 and the stopping element 32 together. The stopping element 32 can be moved upwards and downwards relative to the screw in the holding hole 3231 to adjust the height of the stopping arm 322 with respect to the electronic device until the stopping arms 322 abut a top of the electronic device.

The second fixing component 20 defines a second basic plate 21 and a second fixing plate 22 bending upwards from an end of the second basic plate 21. The second basic plate 21 is rectangular and has two installing holes 211 corresponding to the through holes 111 for fixing the second fixing component 20 to the first fixing component 10 via screws (not shown). The second fixing plate 22 is substantially rectangular with a top side thereof shaped to show an arc shape similar to that of the first fixing plate 12. A wire hole 221 is opened in the center of the second fixing plate 22 corresponding to the wire hole 121 for allowing a test cable (not shown) to pass therethrough to transmit signal. The wire hole 221 is surrounded by a plurality of supporting holes 222. The supporting holes 222 are arranged symmetrically with the same distance in horizontal direction and adapted for fixing supporting rods 23. The supporting rods 23 are all slender. It should be noted that the second fixing component might be just a rectangular plate with a plurality of supporting rods mounted thereon and a plurality of installing holes formed thereon. Accordingly, the first fixing plate of the first fixing component has a plurality of engaging holes corresponding to the installing holes for removably fastening the second fixing component to the first fixing component via screws.

Figure 3:
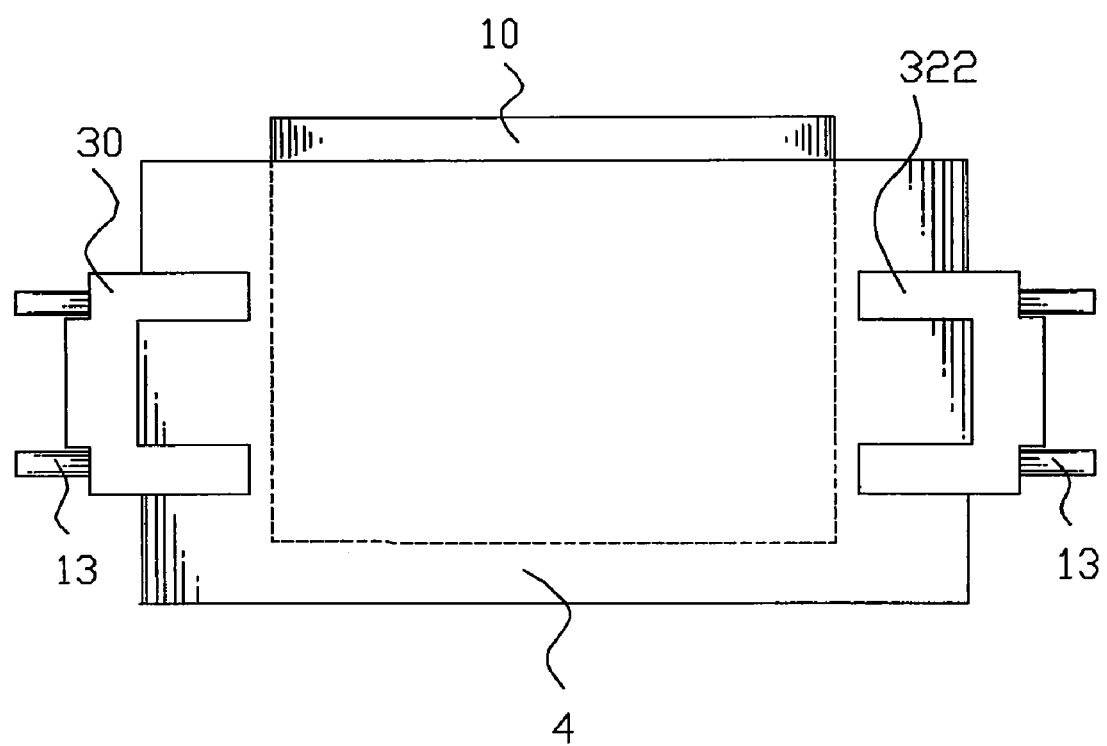
FIG. 3 is a schematic view illuminating the state of the test fixture of FIG. 1 holding a laptop computer, wherein a second fixing component is removed.

Please refer to FIG. 2 and FIG. 3, when the test fixture is used to test an antenna characteristic of a laptop computer, an upper cover 4 of the laptop computer is placed on the first basic plate 11 and blocked by the first fixing plate 12. The stopping members 30 are moved toward the upper cover 4 until the sliding elements 31 abut two sides of the upper cover 4. The stopping elements 32 are adjusted in a vertical direction so that the stopping arms 322 abut a top surface of the upper cover 4. Thus the upper cover 4 is mounted to the test fixture firmly.

Figure 4:
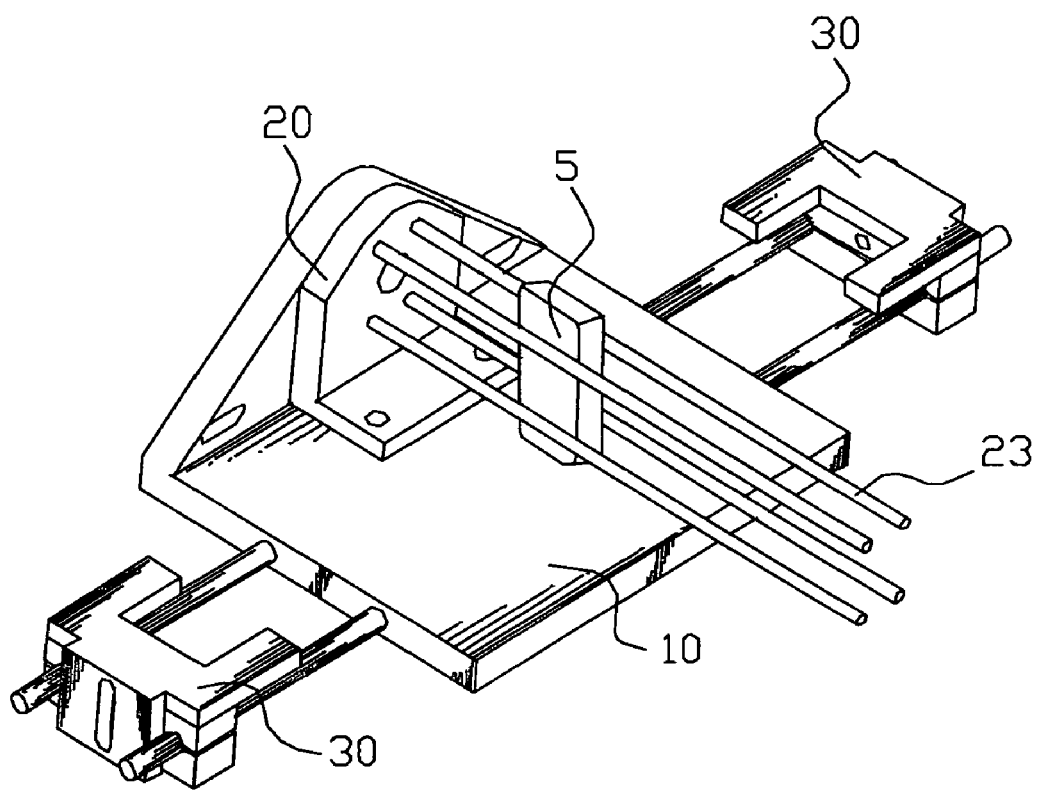
FIG. 4 is a schematic view illuminating the state of the test fixture of FIG. 1 holding a mobile phone, wherein a plurality of through holes is omitted.

Please refer to FIG. 2 and FIG. 4, when testing an antenna characteristic of a mobile phone 5, the second fixing component 20 is mounted to the first fixing component 10. The supporting rods 23 are inserted into the corresponding supporting holes 222 for clamping the mobile phone 5 therebetween. In addition, a tape (not shown) may be provided to wrap the mobile phone 5 and the supporting rods 23 in order to fix the mobile phone 5 to the supporting rods 23 firmly.

As described above, the first fixing component 10 mounted to the supporting base has the first basic plate 11 used for carrying the electronic device, the first fixing plate 12 and stopping member 30 used for positioning and fixing the electronic device of biggish size, such as the laptop computer. Such structure is a simple, and easy to be manufactured and assembled. Furthermore, the stopping member 30 can be moved on the sliding rods 13, which makes the first fixing component 10 fix the electronic devices of different sizes. Meanwhile, the second fixing component 20 with the supporting rods 23 is removably mounted on the first fixing component 10, which is enabled to fix the electronic device of small size, such as mobile phone 5. Thus the test fixture can fix the electronic devices of different sizes, which enlarges the application range of the test fixture.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A test fixture mounted to a supporting base and adapted for holding an electronic device for testing an antenna characteristic of the electronic device, the test fixture comprising:
    a first fixing component adapted for being mounted to the supporting base and having a first basic plate adapted for carrying the device, an end of the first basic plate extending substantially perpendicularly to form a first fixing plate, a surface of which blocks the device, and an opposite surface of which is used for being mounted to the supporting base; and
    a second fixing component removably mounted to the first fixing component, the second fixing component having a plurality of supporting rods suspending above the first basic plate adapted for clamping the device therebetween, the second fixing component including a second fixing plate removably attached to the first fixing plate, one end of the supporting rods being fixed on the second fixing plate; and
    a stopping member slidably mounted on a sliding rod mounted to a side of the first basic plate, and adapted for fixing the device on the first basic plate.

2. The test fixture as claimed in claim 1, wherein the first fixing component has a wire hole passing therethrough, the second fixing component also has a wire hole corresponding to the wire hole of the first fixing component for transmitting a signal.

3. The test fixture as claimed in claim 1, wherein the second fixing component further comprises a second basic plate extending perpendicularly from an end of the second fixing plate and removably laid on the first basic plate.

4. The test fixture as claimed in claim 1, wherein the stopping member has a stopping arm slidable towards the first basic plate and adjusting a vertical height thereof with respect to the first basic plate for being against a top of the device.

5. The test fixture as claimed in claim 4, wherein the stopping member has a sliding element slidably mounted on the sliding rod and a holding plate fixed on the sliding element and intersecting with the stopping arm, the holding plate is movable in a direction perpendicular to the first basic plate in order to ensure the stopping arm is against a top of the device for fixing the device.

\* \* \* \* \*